(12) United States Patent
Lin et al.

(10) Patent No.: US 6,302,189 B1
(45) Date of Patent: Oct. 16, 2001

(54) ENGAGEMENT STRUCTURE OF A FAN

(75) Inventors: Tsu-liang Lin; Kuo-cheng Lin; Wen-shi Huang, all of Taoyan Shien (TW)

(73) Assignee: Delta Electronics, Inc. (TW)

( * ) Notice: Subject to any disclaimer, the term of this patent is extended or adjusted under 35 U.S.C. 154(b) by 0 days.

(21) Appl. No.: 09/680,143

(22) Filed: Oct. 3, 2000

(30) Foreign Application Priority Data

Jun. 16, 2000 (TW) ................................................ 089210428

(51) Int. Cl.[7] ........................................................ H05K 7/20
(52) U.S. Cl. .......................... 165/80.3; 165/121; 361/697
(58) Field of Search ................................. 165/80.3, 121, 165/185; 361/697, 704; 257/722

(56) References Cited

U.S. PATENT DOCUMENTS

| | | | |
|---|---|---|---|
| 5,495,392 | * 2/1996 | Shen | 361/697 |
| 5,943,209 | * 8/1999 | Liu | 361/695 |
| 6,137,680 | * 10/2000 | Kodaira et al. | 361/697 |
| 6,179,046 | * 1/2001 | Hwang et al. | 165/80.03 |

* cited by examiner

Primary Examiner—Allen Flanigan
(74) Attorney, Agent, or Firm—Martine & Penilla, LLP

(57) ABSTRACT

An engagement structure of a fan, which is engaged with a heat dissipation plate having a plurality of heat dissipation fins. A plurality of lower engagement portions with inverted-L-shapes is formed on the plurality of heat dissipation fins. A plurality of clearances substantially parallel to the plurality of heat dissipation fins is formed on each of the lower engagement portions. The engagement structure includes a fan frame and a plurality of upper engagement portions with L-shapes. The plurality of upper engagement portions is elastically mounted around the fan frame. Each of the upper engagement portions includes an L-shaped portion. A plurality of ribs is formed on the L-shaped portions. When assembling the engagement structure with the heat dissipation plate, the L-shaped portions are engaged with the lower engagement portions with inverted-L-shapes for mounting in a vertical direction, while the plurality of ribs are engaged with the plurality of clearances for mounting in a horizontal direction.

5 Claims, 2 Drawing Sheets

ENGAGEMENT STRUCTURE OF A FAN

BACKGROUND OF THE INVENTION

1. Field of the Invention

The invention relates to an engagement structure of a fan, in particular, to an engagement structure capable of facilitating the assembling of the fan with a heat dissipation plate.

2. Description of the Related Art

Conventionally, bolts are usually used to fix a fan onto a heat dissipation plate, as shown in FIG. 1. Referring to FIG. 1, four holes 101 are formed on the fan 100. When assembling the fan 100 with the heat dissipation plate 200, four bolts 300 are screwed to the holes or slots (not shown) of the heat dissipation plate 200 through the four holes 101.

In the assembling method of the above-mentioned structure, since bolts are used, some tool, such as a screwdriver or similar device, is needed to facilitate the assembling. Therefore, the assembling costs are high and the method is not advantageous to a manufacturer. Furthermore, the structure cannot be easily disassembled and the method is not advantageous to the manufacturer and the user.

SUMMARY OF THE INVENTION

It is therefore an object of the invention to provide an engagement structure of both a fan and a heat dissipation plate, which is capable of facilitating both the assembly and disassembly of both the fan and the heat dissipation plate to reduce the assembling costs.

According to one aspect of the invention, an engagement structure of a fan, which is engaged with a heat dissipation plate having a plurality of heat dissipation fins, is disclosed. A plurality of lower engagement portions with inverted-L-shapes is formed on the plurality of heat dissipation fins. A plurality of clearances substantially parallel to the plurality of heat dissipation fins is formed on each of the lower engagement portions. The engagement structure includes a fan frame and a plurality of upper engagement portions with L-shapes. The plurality of upper engagement portions is elastically mounted around the fan frame. Each of the upper engagement portions includes an L-shaped portion. A plurality of ribs is formed on the L-shaped portions. When assembling the engagement structure with the heat dissipation plate, the L-shaped portions are engaged with the lower engagement portions with inverted-L-shapes for mounting them in a vertical direction, while the plurality of ribs being engaged with the plurality of clearances for mounting them in a horizontal direction.

An inclined plane may be formed under each of the L-shaped portions of the upper engagement portions so that the inclined planes 15 contact with the lower engagement portions and then separate in order to engage the L-shaped portions and the lower engagement portions with each other. In addition, each of the upper engagement portions may be made of an elastic material.

DETAILED DESCRIPTION OF THE INVENTION

1. First Embodiment

Figure 1:
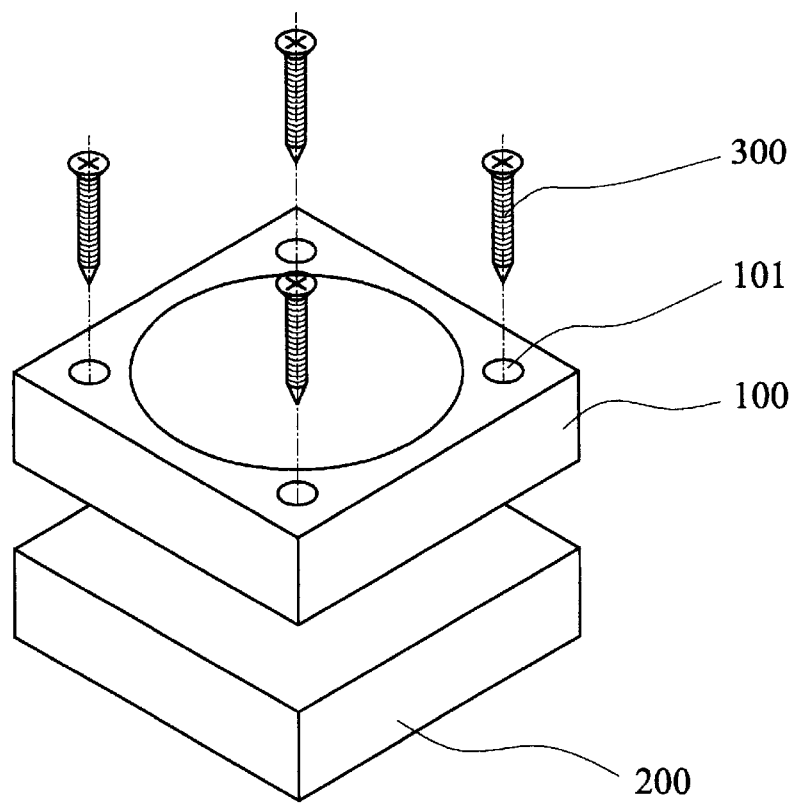
FIG. 1 shows a conventional assembly structure of a fan with a heat dissipation plate.
Figure 2:
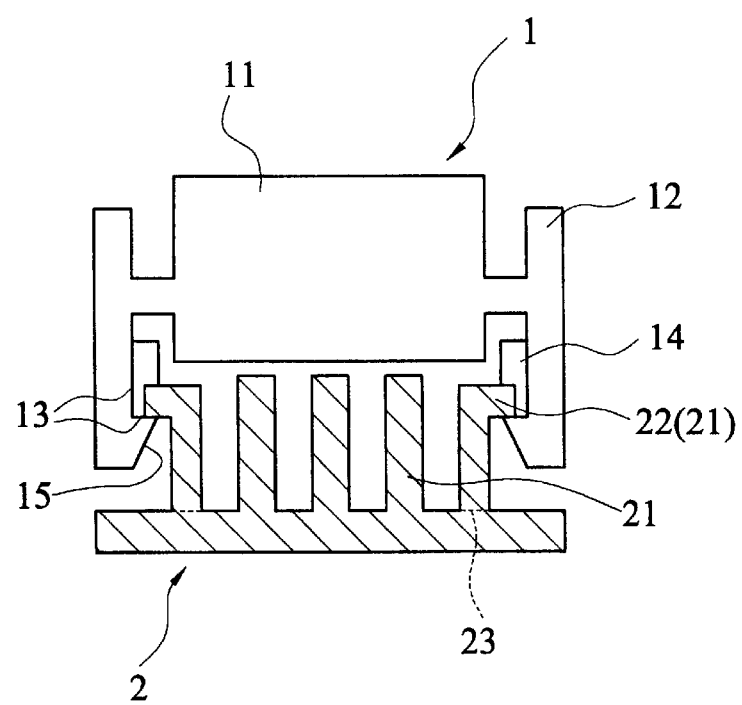
FIG. 2 shows an engagement structure of a fan with a heat dissipation plate in accordance with a first embodiment of the invention.

FIG. 2 shows an engagement structure of a fan with a heat dissipation plate in accordance with a first embodiment of the invention. Referring to FIG. 2, the fan 1 includes a fan frame 11 and a plurality of upper engagement portions 12. The upper engagement portions 12 are elastically mounted around the fan frame 11. Optionally, the upper engagement portions 12 can be integrally formed with the fan frame 11 and have the property of elasticity.

A plurality of L-shaped portions 13 is formed on each of the upper engagement portions 12. A rib 14 and an inclined plane 15, directed towards the center of the fan 1, are formed on each of the L-shaped portions 13. In addition, the heat dissipation plate 2 includes a plurality of heat dissipation fins 21. A plurality of lower engagement portions 22 with inverted-L shapes are formed on two predetermined heat dissipation fins 21, as shown in this drawing. A projection is outwardly formed on the upper end of each of the lower engagement portions 22. A clearance 23 is formed in each of the lower engagement portions 22, as will be described later.

Figure 3:
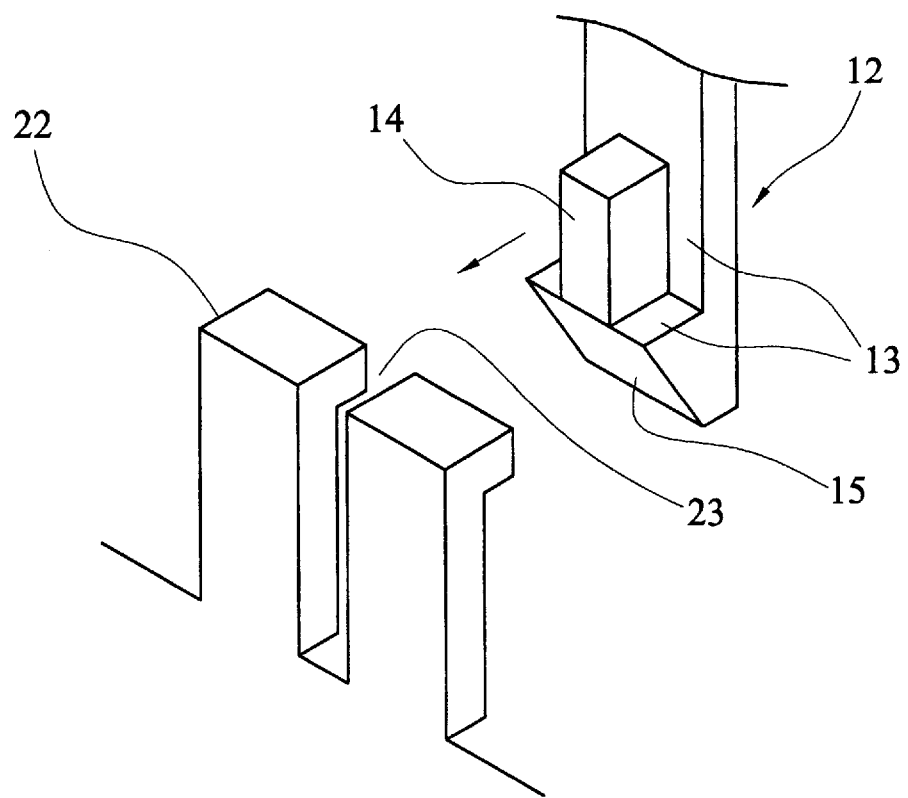
FIG. 3 is a partial pictorial view showing the engagement structure of the fan with the heat dissipation plate as shown in FIG. 2.

FIG. 3 is a partial pictorial view showing the engagement structure of the fan with the heat dissipation plate as shown in FIG. 2. Referring to FIG. 3, both the function and the structure of the clearance 23 can be easily shown.

Referring to FIGS. 2 and 3, when assembling the fan 1 with the heat dissipation plate 2, the upper engagement portions 12 and the lower engagement portions 22 are engaged with each other. In this case, the L-shaped portions 13 engage with the inverted-L-shaped lower engagement portion 22 so as to fix the fan 1 and the heat dissipation plate 2 in the vertical direction. On the other hand, the ribs 14 are inserted into the clearances 23 so as to fix the fan 1 and the heat dissipation plate 2 in a horizontal direction. The fan 1 is thus stably mounted on the heat dissipation plate 2 by the horizontal and vertical fixing method.

The inclined planes 15 are helpful in the above-mentioned engagement operation. When engaging the fan 1 with the heat dissipation plate 2, it is not necessary to outwardly expand the L-shaped portions 13 of the upper engagement portion 12. The left and right inclined planes 15 of the upper engagement portions 12 need only to be in contact with the lower engagement portions 22.

Then, a downward force is applied on the fan 1 in order to allow the L-shaped portions 13 expand outward and engage with the lower engagement portions 22. After finishing the engagement, the L-shaped portions 13 contract to allow the upper engagement portion 12 to stably engage with the lower engagement portion 22 due to the elasticity of the upper engagement portion 12.

When disassembling the fan 1 and the heat dissipation plate 2, simply pressing the upper ends of the plurality of upper engagement portions 12 inward expands the plurality of L-shaped portions 13 outward. In this case, it is only needed to remove the fan 1 to complete the disassembling.

2. Second Embodiment

Figure 4:
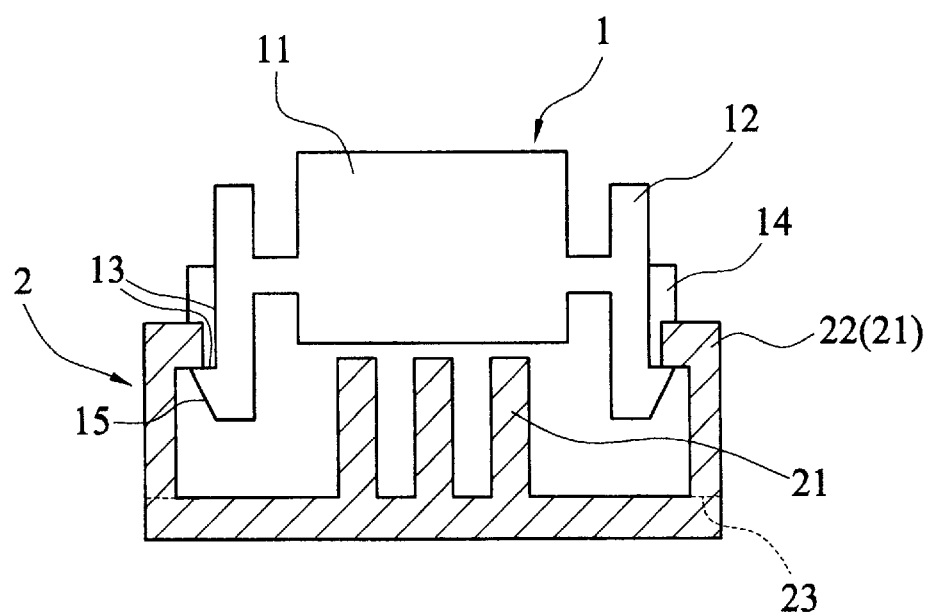
FIG. 4 shows an engagement structure of a fan with a heat dissipation plate in accordance with a second embodiment of the invention.

FIG. 4 shows an engagement structure of a fan 1 with a heat dissipation plate 2 in accordance with a second embodiment of the invention. Referring to FIG. 4, the fan 1 includes a fan frame 11 and a plurality of upper engagement portions 12. The upper engagement portions 12 are elastically fixed around the fan frame 11. Optionally, the upper engagement portions 12 can be integrally formed with the fan frame 11 and have the property of elasticity.

A plurality of L-shaped portions 13 is formed on each of the upper engagement portions 12. A rib 14 and an inclined plane 15, directed out from the center of the fan 1, are formed on each of the L-shaped portions 13. In addition, the heat dissipation plate 2 includes a plurality of heat dissipation fins 21. A plurality of lower engagement portions 22 with inverted-L shapes are formed on two predetermined heat dissipation fins 21, as shown in this drawing. A projection is formed inwardly on the upper end of each of the lower engagement portions 22. A clearance 23 is formed in each of the lower engagement portions 22.

In this embodiment, the detail structures of the upper engagement portion 12 and the upper engagement portion 22 are shown in FIG. 3

Referring to FIGS. 4 and 3, when assembling the fan 1 with the heat dissipation plate 2, the upper engagement portions 12 and the lower engagement portions 22 are engaged with each other. In this case, the L-shaped portions 13 engage with the inverted-L-shaped lower engagement portion 22 so as to fix the fan 1 and the heat dissipation plate 2 in a vertical direction. In addition, the ribs 14 are inserted into the clearances 23 so as to fix the fan 1 and the heat dissipation plate 2 in a horizontal direction. The fan 1 is thus stably fixed on the heat dissipation plate 2 by the horizontal and vertical fixing method.

The inclined planes 15 are helpful to the above-mentioned engagement operation. When engaging the fan 1 onto the heat dissipation plate 2, it is not necessary to contract the L-shaped portions 13 of the upper engagement portion 12 inward. It is necessary only to allow the left and right inclined planes 15 of the upper engagement portions 12 contact with the lower engagement portions 22. Then, a downward force is applied on the fan 1 in order to let the L-shaped portions 13 contract inwardly and engage with the lower engagement portions 22. After finishing the engagement, the L-shaped portions 13 expand to allow the upper engagement portion 12 engage with the lower engagement portion 22 stably due to the elasticity of the upper engagement portion 12.

When disassembling the fan 1 and the heat dissipation plate 2, it is necessary only press the upper ends of the plurality of upper engagement portions 12 outward to compress the plurality of L-shaped portions 13 inward. In this case, it is only needed to remove the fan 1 to complete the disassembly.

Therefore, according to the above-mentioned structures of the embodiments, the fan 1 and the lower engagement portions 22 can easily engage with each other in a horizontal and vertical direction by way of the L-shaped portions 13, ribs 14, and inclined planes 15. In general, the lower engagement portions 22 of the heat dissipation plate 2 are made of aluminum. Furthermore, the structure of the heat dissipation plate 2 can be easily formed by an extrusion method followed by the formation of the clearances 23.

As a result, according to the engagement structure of the fan, the fan and the heat dissipation plate can be quickly assembled and disassembled without using fastening elements such as bolts, rivets, or similar methods. Using this method the manufacturing costs can be reduced and the structure can be easily disassembled.

While the invention has been described by way of example and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. An engagement structure of a fan, which is engaged onto a heat dissipation plate, the heat dissipation plate having a plurality of heat dissipation fins, a plurality of lower engagement portions with inverted-L-shapes being formed on said plurality of heat dissipation fins, and a plurality of clearances substantially parallel to said plurality of heat dissipation fins being formed on each of said lower engagement portions, said engagement structure comprising:

a fan frame; and a plurality of upper engagement portions with L-shapes elastically mounted around said fan frame, each of said upper engagement portions including an L-shaped portion, and a plurality of ribs being formed on said L-shaped portions, wherein when assembling said engagement structure with said heat dissipation plate, said L-shaped portions are engaged with said lower engagement portions with inverted-L-shapes for mounting in a vertical direction, while said plurality of ribs being engaged with said plurality of clearances for mounting in a horizontal direction.

2. The engagement structure according to claim 1, wherein an inclined plane is formed under each of said L-shaped portions of said upper engagement portions so that said inclined planes 15 contact with said lower engagement portions and then separate in order to allow said L-shaped portions and said lower engagement portions to engage with each other.

3. The engagement structure according to claim 1, wherein each of said upper engagement portions is made of an elastic material.

4. The engagement structure according to claim 1, wherein a protruded lower part of said L-shaped portions of said upper engagement portions is pointing inward to engage with a corresponding protruded upper part of said inverted L-shaped portions which is pointing outward of said lower engagement portions.

5. The engagement structure according to claim 1, wherein a protruded lower part of said L-shaped portions of said upper engagement portions is pointing outward to engage with a corresponding protruded upper part of said inverted L-shaped portions which is pointing inward of said lower engagement portions.

* * * * *